US012633830B2

(12) United States Patent     (10) Patent No.:   US 12,633,830 B2

Chen     (45) Date of Patent:    May 19, 2026

(54) POWER CONVERTER HAVING SPECTRUM SPREADING CONTROL MECHANISM

(71) Applicant: ANPEC ELECTRONICS CORPORATION, Hsinchu (TW)

(72) Inventor: Chih-Ning Chen, Taipei City (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 246 days.

(21) Appl. No.: 18/415,564

(22) Filed: Jan. 17, 2024

(65) Prior Publication Data

US 2025/0070667 A1     Feb. 27, 2025

(30) Foreign Application Priority Data

Aug. 24, 2023     (TW) .................................. 112131782

(51) Int. Cl.
| | |
|---|---|
| *H02M 3/158* | (2006.01) |
| *H02M 1/00* | (2007.01) |
| *H02M 1/44* | (2007.01) |
| *H03K 19/0185* | (2006.01) |

(52) U.S. Cl.
CPC .............. *H02M 3/158* (2013.01); *H02M 1/44* (2013.01); *H03K 19/018521* (2013.01); *H02M 1/0025* (2021.05)

(58) Field of Classification Search
CPC ........ H02M 1/0025; H02M 1/08; H02M 1/44; H02M 3/155–1588; H02K 19/018
See application file for complete search history.

(56) References Cited

U.S. PATENT DOCUMENTS

| | | | |
|---|---|---|---|
| 7,504,810 B1 * | 3/2009 | Tagare .................... | H02M 1/44 |
| | | | 323/282 |
| 2018/0109246 A1 * | 4/2018 | Zaplana ............... | H03B 5/1265 |
| 2019/0013733 A1 * | 1/2019 | Trichy .................. | H02M 1/088 |

OTHER PUBLICATIONS

Martinez, Robert and Zhang, Zhemin, Fundamentals of EMI Requirements for an Isolated DC/DC Converter, Feb. 2021, Texas Instruments Inc., p. 3-6 (Year: 2021).*

* cited by examiner

*Primary Examiner* — Crystal L Hammond
*Assistant Examiner* — Nicolas Alden Chapa Mills
(74) *Attorney, Agent, or Firm* — Li & Cai Intellectual Property Office

(57) ABSTRACT

A power converter having a spectrum spreading control mechanism is provided. In the power converter, a buffer circuit, according to a plurality of energy upper limit values respectively of a plurality of frequency bands falling within a switching frequency range, determines a plurality of buffering ratios corresponding respectively to the plurality of frequency bands. In the power converter, the buffer circuit buffers a voltage signal from an inductor based on one of the plurality of buffering ratios that corresponds to one of the plurality of frequency bands within which a switching frequency of the high-side switch and the low-side switch currently falls. In the power converter, an on-time determining circuit determines an on-time of the high-side switch and an on-time of the low-side switch, according to the buffered voltage signal.

16 Claims, 9 Drawing Sheets

POWER CONVERTER HAVING SPECTRUM SPREADING CONTROL MECHANISM

CROSS-REFERENCE TO RELATED PATENT APPLICATION

This application claims the benefit of priority to Taiwan Patent Application No. 112131782, filed on Aug. 24, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a power converter, and more particularly to a power converter having a spectrum spreading control mechanism.

BACKGROUND OF THE DISCLOSURE

With the rapid development of electronic power technology, various electronic devices have become indispensable in people's lives. Switch components are widely used in the various electronic devices such as power converters. However, the switch components of the power converters often operate at a high frequency. When the switch components of the power converters operate at the high frequency, high electromagnetic interference (EMI) is generated to cause interference to operations of the power converters. As a result, the power converters cannot operate normally, and operational efficiencies of the power converters are reduced.

SUMMARY OF THE DISCLOSURE

In response to the above-referenced technical inadequacies, the present disclosure provides a power converter having a spectrum spreading control mechanism. The power converter includes a high-side switch, a low-side switch, a driver circuit, a control circuit, a buffer circuit and an on-time determining circuit. A first terminal of the high-side switch is coupled to an input voltage. A first terminal of the low-side switch is connected to a second terminal of the high-side switch. A second terminal of the low-side switch is grounded. A node between the first terminal of the low-side switch and the second terminal of the high-side switch is connected to a first terminal of an inductor. The driver circuit is connected to a control terminal of the high-side switch and a control terminal of the low-side switch. The control circuit is connected to the driver circuit. The control circuit is configured to control the driver circuit to drive the high-side switch and the low-side switch. The buffer circuit has an input terminal connected to a second terminal of the inductor. The buffer circuit, according to a plurality of energy upper limit values respectively of a plurality of frequency bands falling within a switching frequency range, determines a plurality of buffering ratios corresponding, respectively to the plurality of frequency bands between which a switching frequency of the high-side switch and the low-side switch is changed. Each time when the input terminal of the buffer circuit receives a voltage signal from the inductor, the buffer circuit buffers a voltage of the voltage signal from the inductor based on one of the plurality of buffering ratios that corresponds to one of the plurality of frequency bands within which the switching frequency of the high-side switch and the low-side switch currently falls. The on-time determining circuit is connected to the buffer circuit and the control circuit. The on-time determining circuit is configured to determine an on-time of the high-side switch and an on-time of the low-side switch to output an on-time instructing signal, according to the voltage signal that is buffered by the buffer circuit. The control circuit controls the driver circuit to drive the high-side switch and the low-side switch according to the on-time instructing signal from the on-time determining circuit.

In one of the possible or preferred embodiments, the buffer circuit includes a plurality of buffering modulator circuit. Each of the plurality of buffering modulator circuit includes a plurality of first transistors. In each of the plurality of buffering modulator circuits, a first terminal of one of the plurality of first transistors is connected to an input terminal of the buffer circuit. In each of the plurality of buffering modulator circuits, a second terminal of another of the plurality of first transistors is connected to an input terminal of the on-time determining circuit. In each of the plurality of buffering modulator circuits, a first terminal of each of the plurality of first transistors except for the one of the plurality of first transistors is connected to a second terminal of the first transistor disposed adjacent thereto. In each of the plurality of buffering modulator circuits, a control terminal of at least one of the plurality of first transistors is connected to an oscillator circuit, and control terminals of others of the plurality of first transistors are coupled to an operation control voltage.

In one of the possible or preferred embodiments, the buffer circuit further includes a second transistor, a third transistor, a fourth transistor and a fifth transistor. A first terminal of the second transistor is connected to the input terminal of the buffer circuit. A first terminal of the third transistor is connected to a second terminal of the second transistor. A first terminal of the fourth transistor is connected to the input terminal of the buffer circuit. A first terminal of the fifth transistor is connected to a second terminal of the fourth transistor and a second terminal of the third transistor. A second terminal of the fifth transistor is connected to the input terminal of the on-time determining circuit. A control terminal of the second transistor, a control terminal of the third transistor and a control terminal of the fourth transistor are coupled to the operation control voltage. A control terminal of the fifth transistor is coupled to a first reference voltage level.

In one of the possible or preferred embodiments, the buffer circuit further includes a sixth transistor and a seventh transistor. A first terminal of the sixth transistor is connected to the input terminal of the buffer circuit. A control terminal of the sixth transistor is coupled to the operation control voltage. A first terminal of the seventh transistor is connected to a second terminal of the sixth transistor. A second terminal of the seventh transistor is coupled to a second reference voltage level. A control terminal of the seventh transistor is coupled to the second reference voltage level.

In one of the possible or preferred embodiments, the buffer circuit further includes a switching transistor. A first terminal of the switching transistor is connected to the input terminal of the buffer circuit. A second terminal of the switching transistor is connected to a control terminal of the sixth transistor. A control terminal of the switching transistor is coupled to the operation control voltage.

In one of the possible or preferred embodiments, the buffer circuit further includes an eighth transistor, a ninth transistor, a tenth transistor and an eleventh transistor. A first terminal of the eighth transistor is connected to the input terminal of the buffer circuit. A first terminal of the ninth transistor is connected to a second terminal of the eighth transistor. A second terminal of the ninth transistor is connected to the control terminal of the sixth transistor. A control terminal of the ninth transistor is coupled to the second reference voltage level. A first terminal of the tenth transistor is connected to the input terminal of the buffer circuit. A first terminal of the eleventh transistor is connected to a second terminal of the tenth transistor. A second terminal of the eleventh transistor is connected to a control terminal of the eighth transistor and a control terminal of the tenth transistor. A control terminal of the eleventh transistor is coupled to the second reference voltage level.

In one of the possible or preferred embodiments, the buffer circuit further includes a twelfth transistor, a thirteenth transistor, a fourteenth transistor and a fifteenth transistor. A first terminal of the twelfth transistor is connected to the input terminal of the buffer circuit. A first terminal of the thirteenth transistor is connected to a second terminal of the twelfth transistor. A second terminal of the thirteenth transistor is coupled to the second reference voltage level. A first terminal of the fourteenth transistor is connected to the input terminal of the buffer circuit. A control terminal of the fourteenth transistor is connected to a control terminal of the twelfth transistor. A first terminal of the fifteenth transistor is connected to a second terminal of the fourteenth transistor. A second terminal of the fifteenth transistor is coupled to the second reference voltage level. A control terminal of the fifteenth transistor is connected to a control terminal of the thirteenth transistor and coupled to the first reference voltage level.

In one of the possible or preferred embodiments, the buffer circuit further includes a switching transistor. A first terminal of the switching transistor is connected to the input terminal of the buffer circuit. A second terminal of the switching transistor is connected to the control terminal of the twelfth transistor. A control terminal of the switching transistor is coupled to the operation control voltage.

In one of the possible or preferred embodiments, the buffer circuit further includes a sixteenth transistor and a seventeenth transistor. A first terminal of the sixteenth transistor is connected to the input terminal of the buffer circuit. A control terminal of the sixteenth transistor is connected to the control terminal of the fourteenth transistor. A first terminal of the seventeenth transistor is connected to a second terminal of the sixteenth transistor. A second terminal of the sixteenth transistor is coupled to the first reference voltage level. A control terminal of the seventeenth transistor is connected to the control terminal of the fifteenth transistor.

In one of the possible or preferred embodiments, the buffer circuit further includes an eighteenth transistor, a nineteenth transistor, a twentieth transistor and a twenty-first transistor. A first terminal of the eighteenth transistor is connected to the second terminal of the ninth transistor. A first terminal of the nineteenth transistor is connected to a second terminal of the eighteenth transistor. A second terminal of the nineteenth transistor is coupled to the second reference voltage level. A first terminal of the twentieth transistor is connected to a second terminal of the eleventh transistor. A control terminal of the twentieth transistor is connected to a control terminal of the eighteenth transistor. A first terminal of the twenty-first transistor is connected to a second terminal of the twentieth transistor. A second terminal of the twenty-first transistor is coupled to the second reference voltage level. A control terminal of the twenty-first transistor is connected to a control terminal of the nineteenth transistor.

In one of the possible or preferred embodiments, the buffer circuit further includes a twenty-second transistor and a twenty-third transistor. A first terminal of the twenty-second transistor is connected to the second terminal of the thirteenth transistor. A second terminal of the twenty-second transistor is connected to the first terminal of the twenty-first transistor. A control terminal of the twenty-second transistor is connected to the second terminal of the seventh transistor. A first terminal of the twenty-third transistor is connected to the second terminal of the thirteenth transistor. A second terminal of the twenty-third transistor is connected to the first terminal of the nineteenth transistor. A control terminal of the twenty-third transistor is coupled to a control voltage level.

In one of the possible or preferred embodiments, the buffer circuit further includes a twenty-fourth transistor and a twenty-fifth transistor. A first terminal of the twenty-fourth transistor is connected to the second terminal of the fifteenth transistor. A control terminal of the twenty-fourth transistor is connected to the control terminal of the twentieth transistor. A first terminal of the twenty-fifth transistor is connected to the second terminal of the twenty-fourth transistor. A second terminal of the twenty-fifth transistor is coupled to the second reference voltage level. A control terminal of the twenty-fifth transistor is connected to the first terminal of the twenty-fourth transistor and the control terminal of the twenty-first transistor.

In one of the possible or preferred embodiments, the buffer circuit further includes a twenty-sixth transistor. A first terminal of the twenty-sixth transistor is connected to the control terminal of the twenty-fourth transistor. A second terminal of the twenty-sixth transistor is coupled to the second reference voltage level. A control terminal of the twenty-sixth transistor is coupled to the operation control voltage.

In one of the possible or preferred embodiments, the on-time determining circuit includes a constant current source, a capacitor and a comparator. The constant current source is coupled to a supply voltage. A first terminal of the capacitor is connected to the constant current source and a second terminal of the capacitor is grounded. A first input terminal of the comparator is connected to the first terminal of the capacitor. A second input terminal of the comparator is connected to an output terminal of the buffer circuit. An output terminal of the comparator is connected to an input terminal of the control circuit.

In one of the possible or preferred embodiments, the on-time determining circuit includes a variable current source, a capacitor and a comparator. A control terminal of the variable current source is connected to an output terminal of an oscillator circuit. A first terminal of the capacitor is connected to an output terminal of the variable current source. A second terminal of the capacitor is grounded. A first input terminal of the comparator is connected to the first terminal of the capacitor. A second input terminal of the comparator is connected to an output terminal of the buffer circuit. An output terminal of the comparator is connected to an input terminal of the control circuit.

In one of the possible or preferred embodiments, the on-time determining circuit includes a constant current source, a variable capacitor and a comparator. The constant current source is coupled to a supply voltage. A first terminal of the variable capacitor is connected to the constant current source. A second terminal of the variable capacitor is grounded. A control terminal of the variable capacitor is connected to an output terminal of an oscillator circuit. A first input terminal of the comparator is connected to the first terminal of the variable capacitor. A second input terminal of the comparator is connected to an output terminal of the buffer circuit. An output terminal of the comparator is connected to an input terminal of the control circuit.

In one of the possible or preferred embodiments, the on-time determining circuit includes a variable resistor, a capacitor and a comparator. A first terminal of the variable resistor is coupled to a supply voltage. A control terminal of the variable resistor is connected to an output terminal of an oscillator circuit. A first terminal of the capacitor is connected to a second terminal of the variable resistor and a second terminal of the capacitor is grounded. A first input terminal of the comparator is connected to the first terminal of the capacitor. A second input terminal of the comparator is connected to an output terminal of the buffer circuit. An output terminal of the comparator is connected to an input terminal of the control circuit.

As described above, the present disclosure provides the power converter having the spectrum spreading control mechanism. In the power converter of the present disclosure, the original switching frequency of the high-side switch and the low-side switch is divided into a plurality of switching frequencies that are distributed in the plurality of frequency bands within the switching frequency range. As a result, each time when the high-side switch and the low-side switch are switched, the switching frequency of the high-side switch and the low-side switch does not exceed an upper limit value. Under this condition, strength of an electromagnetic interference (EMI) signal generated when the high-side switch and the low-side switch are switched is effectively reduced. Therefore, the power converter of the present disclosure is capable of operating normally, and an operating efficiency of the power converter of the present disclosure is improved.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
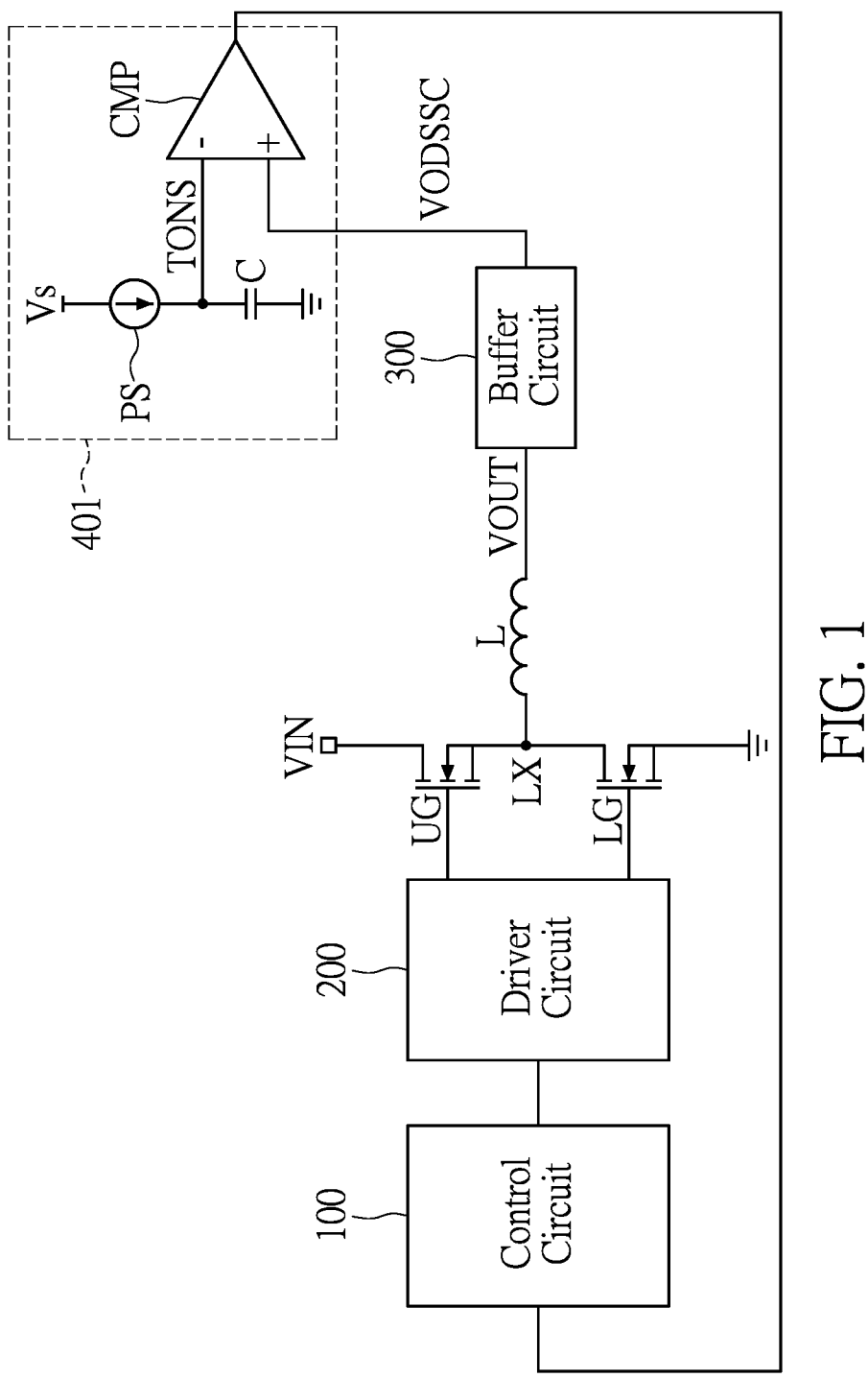
FIG. 1 is a circuit diagram of a power converter having a spectrum spreading control mechanism according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a circuit diagram of a power converter having a spectrum spreading control mechanism according to a first embodiment of the present disclosure.

As shown in FIG. 1, the power converter of the present disclosure includes a high-side switch UG, a low-side switch LG, a driver circuit 200, a control circuit 100, a buffer circuit 300 and an on-time determining circuit 401.

A first terminal of the high-side switch UG is coupled to an input voltage VIN. A first terminal of the low-side switch LG is connected to a second terminal of the high-side switch UG. A second terminal of the low-side switch LG is grounded. A node LX between the first terminal of the low-side switch LG and the second terminal of the high-side switch UG is connected to a first terminal of an inductor L.

An input terminal of the buffer circuit 300 is connected to a second terminal of the inductor L. An output terminal of the buffer circuit 300 is connected to an input terminal of the on-time determining circuit 401. An output terminal of the on-time determining circuit 401 is connected to an input terminal of the control circuit 100.

For example, the on-time determining circuit 401 of the power converter of the first embodiment of the present disclosure includes a capacitor C and a comparator CMP, but the present disclosure is not limited thereto. A first terminal of the capacitor C is connected to a constant current source PS. A second terminal of the capacitor C is grounded. A first input terminal (such as an inverting input terminal) of the comparator CMP is connected to a first terminal of the capacitor C. A second input terminal (such as a non-inverting input terminal) of the comparator CMP is connected to the output terminal of the buffer circuit 300. An output terminal of the comparator CMP is connected to an input terminal of the control circuit 100.

An output terminal of the control circuit 100 is connected to an input terminal of the driver circuit 200. An output terminal of the driver circuit 200 is connected to a control terminal of the high-side switch UG and a control terminal of the low-side switch LG.

It is worth noting that, an amplitude of a switching frequency of the high-side switch UG and the low-side switch LG of the power converter of the present disclosure is divided into a plurality of smaller frequency amplitudes that are distributed in a plurality of frequency bands falling within a switching frequency range. As a result, high energy of an electromagnetic interference (EMI) signal generated when the high-side switch UG and the low-side switch LG are switched each time is dispersed. Therefore, the energy of the electromagnetic interference (EMI) signal generated at the same time point is reduced to be a low value. Therefore, each time when the high-side switch UG and the low-side switch LG are switched, an operation of the power converter of the present disclosure is prevented from being affected by the electromagnetic interference (EMI) signal.

In detail, the buffer circuit 300 of the power converter of the present disclosure determines, according to a plurality of energy upper limit values respectively of a plurality of frequency bands falling within the switching frequency range, a plurality of buffering ratios corresponding respectively to the plurality of frequency bands between which the switching frequency of the high-side switch UG and the low-side switch LG is changed.

The input terminal of the buffer circuit 300 of the power converter of the present disclosure receives a voltage signal VOUT from the inductor L. The buffer circuit 300 buffers a voltage of the voltage signal VOUT from the inductor L to output a buffered voltage signal VODSSC, based on one of the plurality of buffering ratios that corresponds to one of the plurality of frequency bands within which the switching frequency of the high-side switch UG and the low-side switch LG currently falls. When the high-side switch UG and the low-side switch LG are switched at different frequencies that respectively fall within the plurality of frequency bands, the buffer circuit 300 buffers the voltage of the voltage signal VOUT respectively based on the plurality of buffering ratios.

In the power converter of the present disclosure, the on-time determining circuit 401 may determine an on-time of the high-side switch UG and an on-time of the low-side switch LG to output an on-time instructing signal according to the buffered voltage signal VODSSC from the buffer circuit 300.

As described above, for example, the on-time determining circuit 401 may include the comparator CMP and the capacitor C. The first input terminal (such as the inverting input terminal) of the comparator CMP receives a voltage of the first terminal of the capacitor C, and the second input terminal (such as the non-inverting input terminal) of the comparator CMP receives the buffered voltage signal VODSSC from the buffer circuit 300. The comparator CMP compares the voltage of the first terminal of the capacitor C with a voltage of the buffered voltage signal VODSSC to output the on-time instructing signal.

In the power converter of the present disclosure, the control circuit 100 may control operations of the high-side switch UG and the low-side switch LG according to the on-time instructing signal from (the output terminal of the comparator CMP included in) the on-time determining circuit 401.

Figure 6:
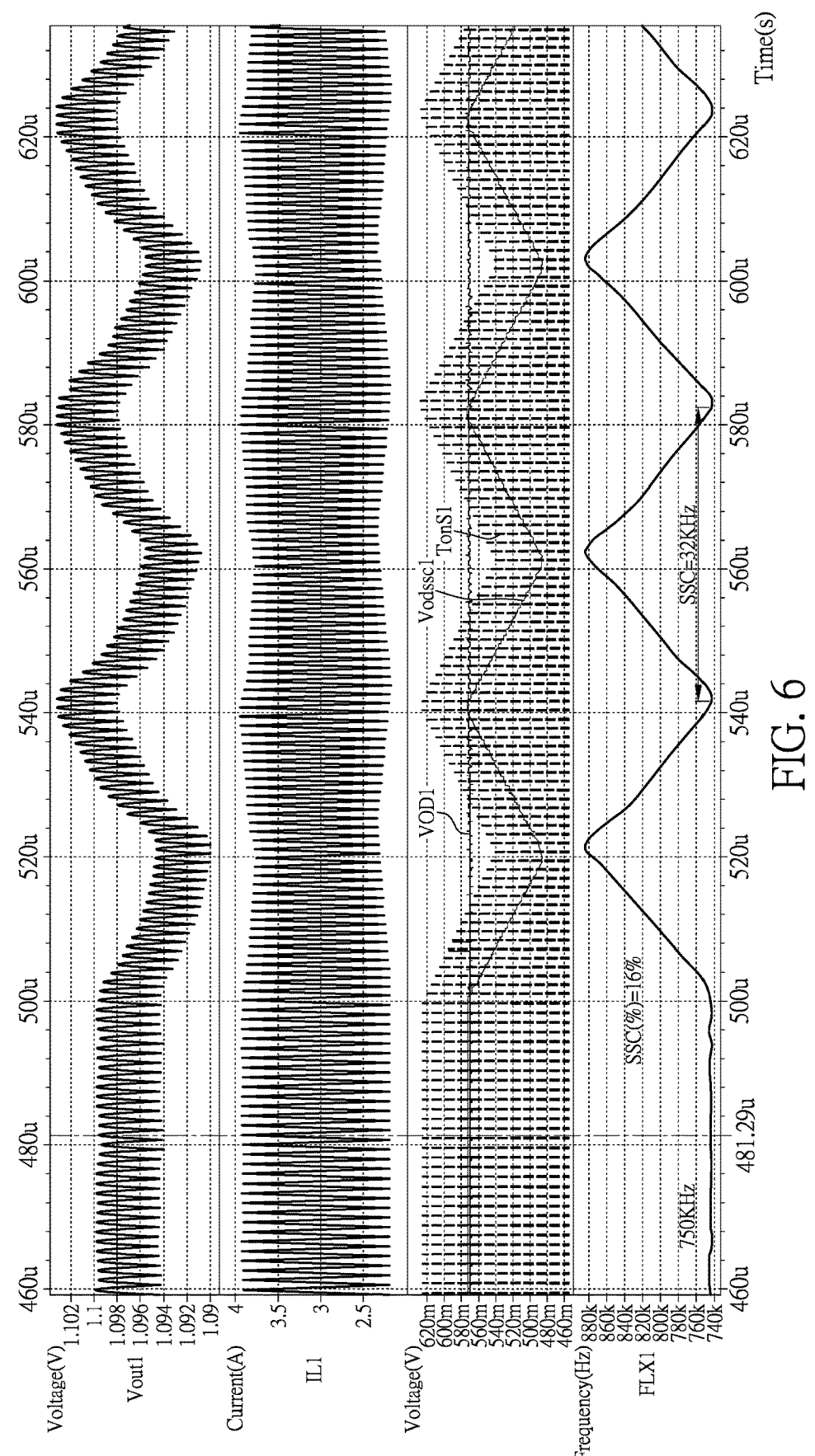
FIG. 6 is a waveform diagram of signals of the power converter having the spectrum spreading control mechanism according to the first to sixth embodiments of the present disclosure.
Figure 7:
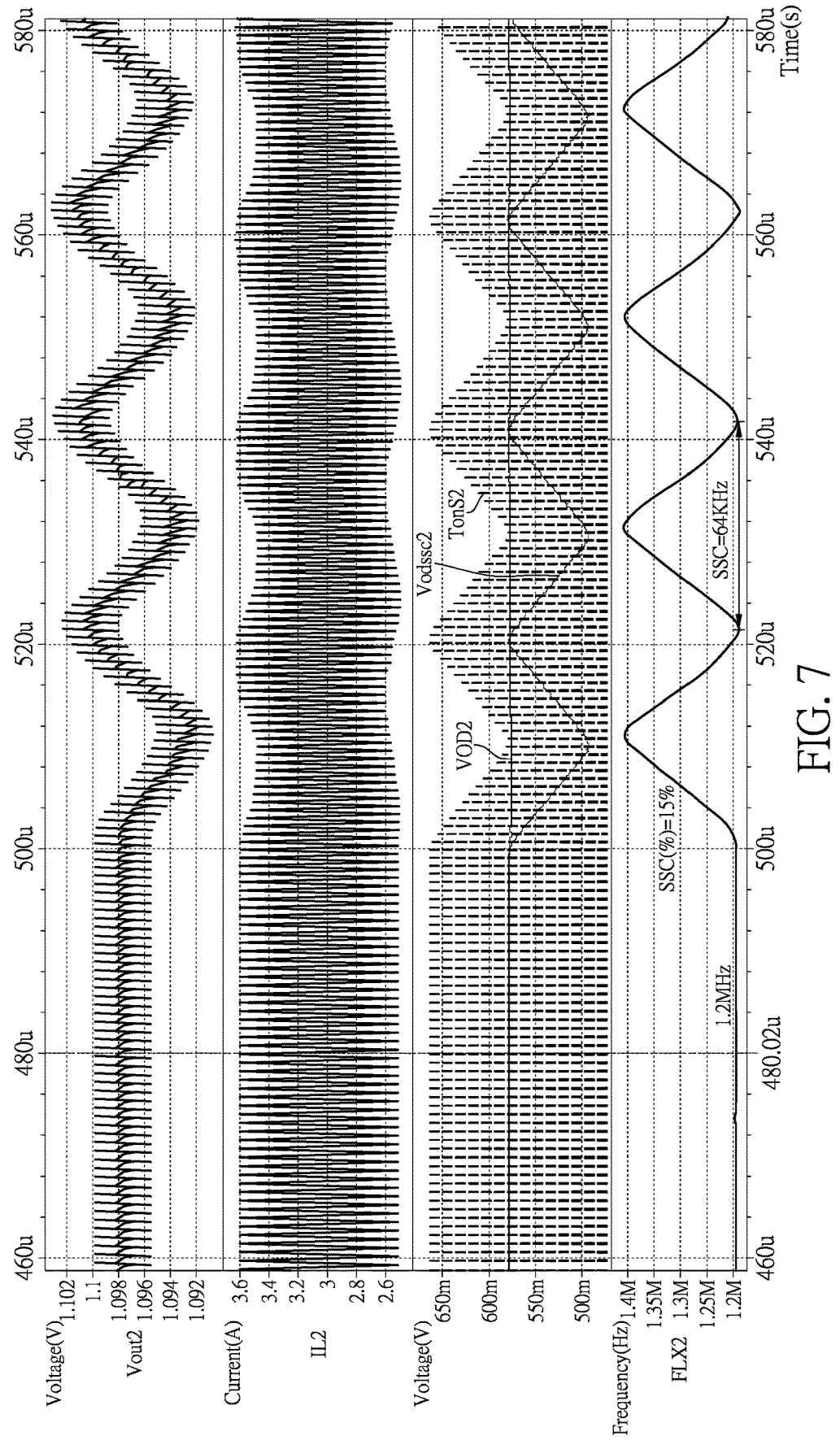
FIG. 7 is a waveform diagram of signals of the power converter having the spectrum spreading control mechanism according to the first to sixth embodiments of the present disclosure.
Figure 8:
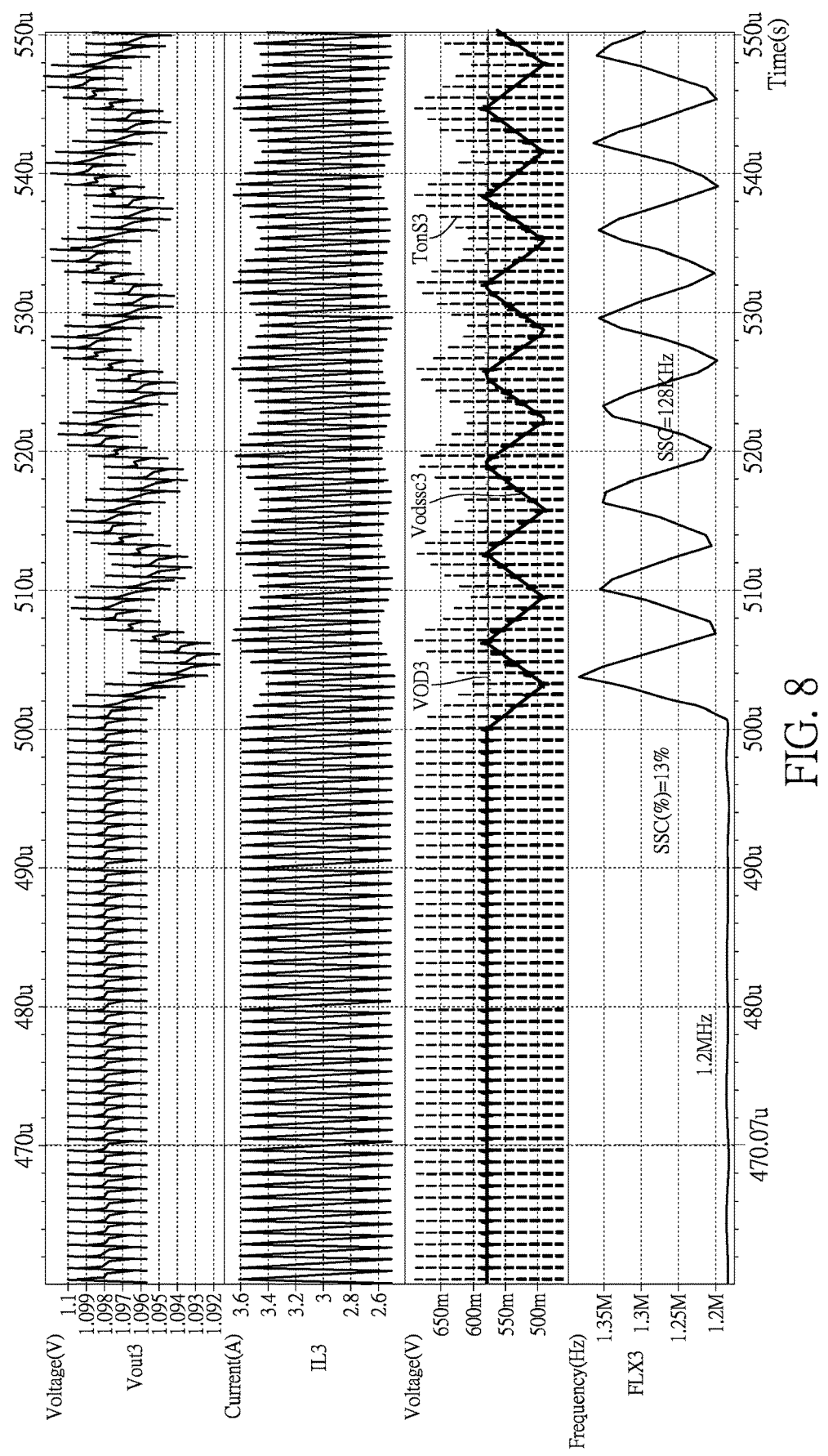
FIG. 8 is a waveform diagram of signals of the power converter having the spectrum spreading control mechanism according to the first to sixth embodiments of the present disclosure.

Reference is made to FIG. 1 and FIGS. 6 to 8, in which FIGS. 6 to 8 are waveform diagrams of signals of the power converter having the spectrum spreading control mechanism according to the first to sixth embodiments of the present disclosure.

For example, in examples of FIGS. 6 to 8, the input voltage VIN received by the first terminal of the high-side switch UG is 5V, and an inductance of the inductor L is 0.68 uH.

In one of the examples, an inductor current signal IL1 flowing through the inductor L is shown in FIG. 6. In the example of FIG. 6, the buffer circuit 300 of the power converter of the present disclosure, based on a buffering ratio SSC of "16%", buffers a voltage of a voltage signal Vout1 from the inductor L to output a buffered voltage signal Vodssc1 having a peak voltage value VOD1.

As shown in FIG. 6, when the buffered voltage signal Vodssc1 that is received from the buffer circuit 300 by the second input terminal of the comparator CMP of the on-time determining circuit 401 is gradually changed, a charged or discharged voltage of a capacitor voltage signal TonS1 that is received from the capacitor C by the first input terminal of the comparator CMP is gradually changed. As a result, the control circuit 100, according to the on-time instructing signal from the comparator CMP of the on-time determining circuit 401, switches the high-side switch UG and the low-side switch LG at a switching frequency of "32 KHz" that is indicated by a switching frequency signal FLX1 as shown in FIG. 6.

In another of the examples, an inductor current signal IL2 flowing through the inductor L is shown in FIG. 7. In the example of FIG. 7, the buffer circuit 300 of the power converter of the present disclosure, based on a buffering ratio SSC of "15%", buffers a voltage of a voltage signal Vout2 from the inductor L to output a buffered voltage signal Vodssc2 having a peak voltage value VOD2.

As shown in FIG. 7, when the buffered voltage signal Vodssc2 that is received from the buffer circuit 300 by the second input terminal of the comparator CMP of the on-time determining circuit 401 is gradually changed, a charged or discharged voltage of a capacitor voltage signal TonS2 that is received from the capacitor C by the first input terminal of the comparator CMP is gradually changed. As a result, the control circuit 100, according to the on-time instructing signal from the comparator CMP of the on-time determining circuit 401, switches the high-side switch UG and the low-side switch LG at a switching frequency of "64 KHz" that is indicated by a switching frequency signal FLX2 as shown in FIG. 7.

In another of the examples, an inductor current signal IL3 flowing through the inductor L is shown in FIG. 8. In the example of FIG. 8, the buffer circuit 300 of the power converter of the present disclosure, based on a buffering ratio SSC of "13%", buffers a voltage of a voltage signal Vout3 from the inductor L to output a buffered voltage signal Vodssc3 having a peak voltage value VOD3.

As shown in FIG. 8, when the buffered voltage signal Vodssc3 that is received from the buffer circuit 300 by the second input terminal of the comparator CMP of the on-time determining circuit 401 is gradually changed, a charged or discharged voltage of a capacitor voltage signal TonS3 that is received from the capacitor C by the first input terminal of the comparator CMP is gradually changed. As a result, the control circuit 100, according to the on-time instructing signal from the comparator CMP of the on-time determining circuit 401, switches the high-side switch UG and the low-side switch LG at a switching frequency of "128 KHz" that is indicated by a switching frequency signal FLX3 as shown in FIG. 8.

Figure 2:
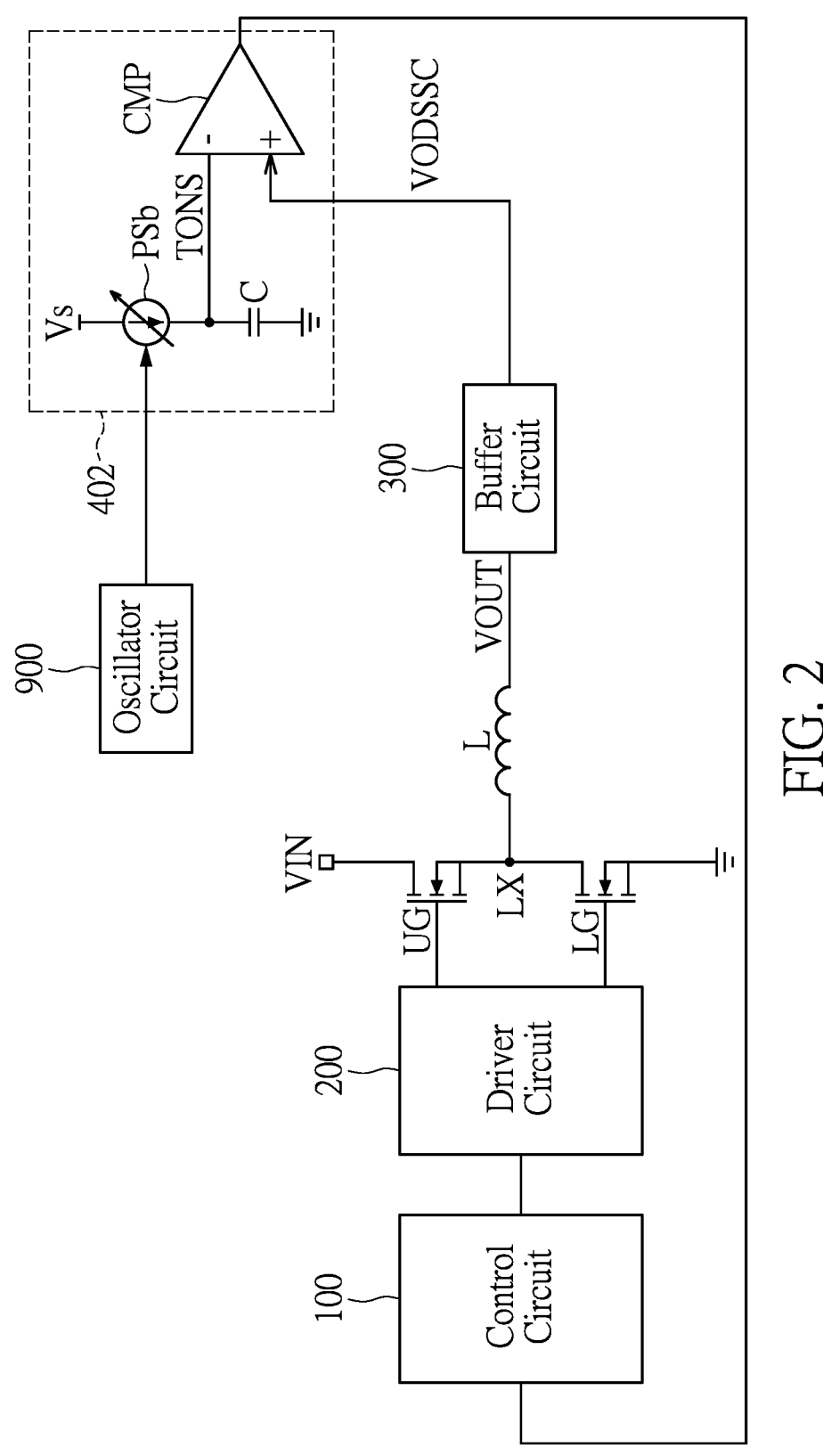
FIG. 2 is a circuit diagram of a power converter having a spectrum spreading control mechanism according to a second embodiment of the present disclosure.

Reference is made to FIG. 2, which is a circuit diagram of a power converter having a spectrum spreading control mechanism according to a second embodiment of the present disclosure. The contents of the second embodiment of the present disclosure that are the same as that of the first embodiment of the present disclosure are not repeated herein.

A difference between the second and first embodiments of the present disclosure is that, an on-time determining circuit 402 of the power converter of the second embodiment of the present disclosure includes a variable current source PSb, the comparator CMP and the capacitor C.

A first terminal of the variable current source PSb is coupled to a supply voltage Vs. A control terminal of the variable current source PSb is connected to an output terminal of an oscillator circuit 900. An output terminal of the variable current source PSb is connected to the first terminal of the capacitor C. The second terminal of the capacitor C is grounded. The first input terminal such as the inverting input terminal of the comparator CMP is connected to the first terminal of the capacitor C. The second input terminal such as the non-inverting input terminal of the comparator CMP is connected to the output terminal of the buffer circuit 300. The output terminal of the comparator CMP is connected to the input terminal of the control circuit 100. The output terminal of the control circuit 100 is connected to the control terminal of the high-side switch UG and the control terminal of the low-side switch LG.

The buffer circuit 300 buffers a voltage signal of the inductor L to the second input terminal such as the non-inverting input terminal of the comparator CMP. At the same time, the variable current source PSb, according to a frequency or a duty cycle of a waveform of an oscillating signal from the oscillator circuit 900, determines a frequency of supplying a current to the first terminal of the capacitor C, so as to determine a speed of increasing the voltage of the first input terminal such as the inverting input terminal of the comparator CMP.

The control circuit 100 switches the high-side switch UG and the low-side switch LG according to a level of the on-time instructing signal from the comparator CMP.

Figure 3:
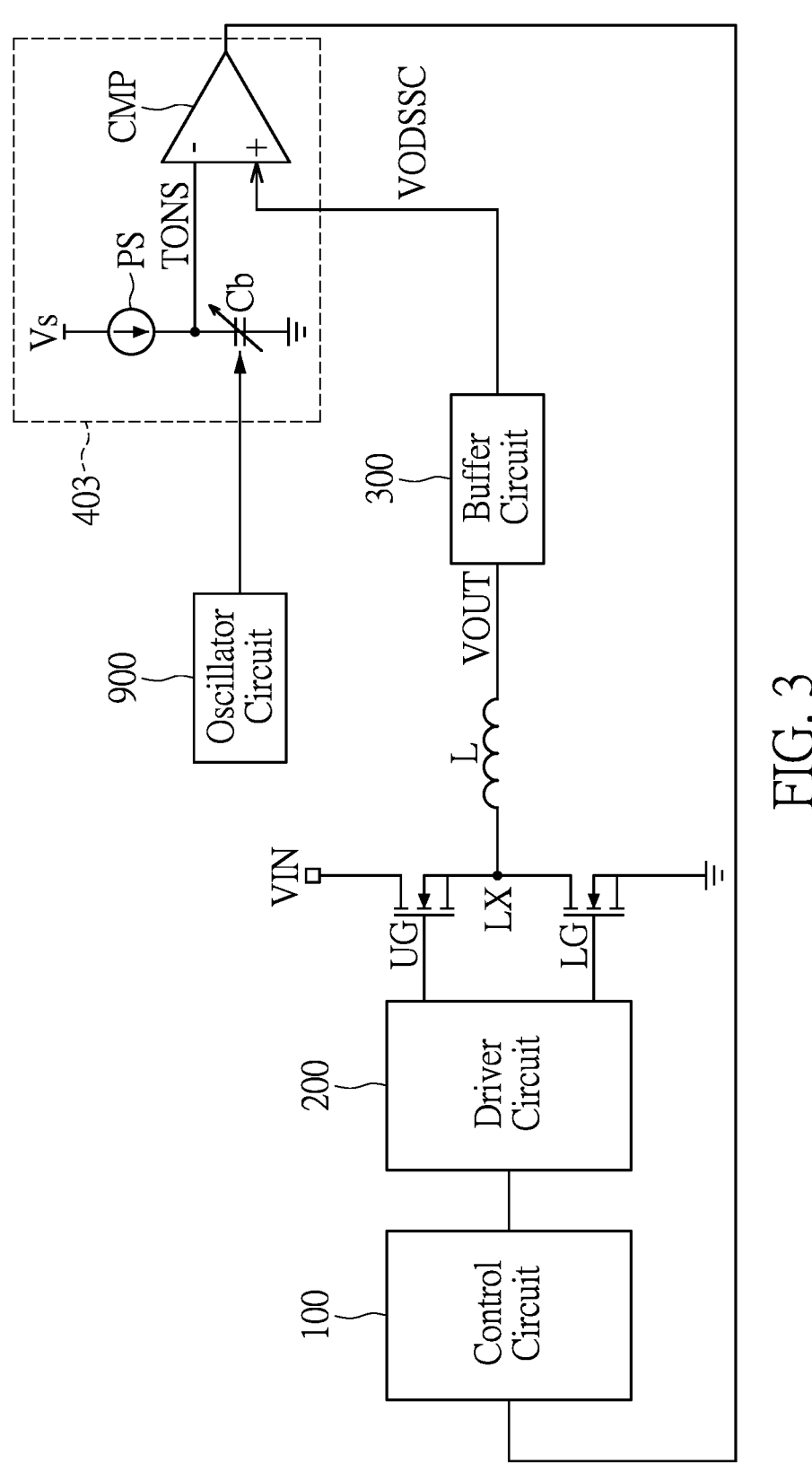
FIG. 3 is a circuit diagram of a power converter having a spectrum spreading control mechanism according to a third embodiment of the present disclosure.

Reference is made to FIG. 3, which is a circuit diagram of a power converter having a spectrum spreading control mechanism according to a third embodiment of the present disclosure.

The contents of the third embodiment of the present disclosure that are the same as that of the first embodiment of the present disclosure are not repeated herein.

A difference between the third and first embodiments of the present disclosure is that, an on-time determining circuit 403 of the power converter of the third embodiment of the present disclosure includes the constant current source PS, the comparator CMP and a variable capacitor Cb.

A first terminal of the constant current source PS is coupled to the supply voltage Vs. An output terminal of the constant current source PS is connected to a first terminal of the variable capacitor Cb. A control terminal of the variable capacitor Cb is connected to the output terminal of the oscillator circuit 900. A second terminal of the variable capacitor Cb is grounded. The first input terminal such as the inverting input terminal of the comparator CMP is connected to the first terminal of the variable capacitor Cb. The second input terminal such as the non-inverting input terminal of the comparator CMP is connected to the output terminal of the buffer circuit 300. The output terminal of the comparator CMP is connected to the input terminal of the control circuit 100. The output terminal of the control circuit 100 is connected to the control terminal of the high-side switch UG and the control terminal of the low-side switch LG.

The constant current source PS supplies a constant current to the variable capacitor Cb.

A capacitance of the variable capacitor Cb depends on the oscillating signal outputted by the oscillator circuit 900. The capacitance of the variable capacitor Cb is changed with a change in the oscillating signal outputted by the oscillator circuit 900. Then, a voltage of the first terminal of the variable capacitor Cb that is inputted to the first input terminal of the variable capacitor Cb is changed with a change in the capacitance of the variable capacitor Cb. Then, the on-time instructing signal outputted by the comparator CMP is changed with a change in the voltage of the first terminal of the variable capacitor Cb. The control circuit 100 switches the high-side switch UG and the low-side switch LG according to the level of the on-time instructing signal from the comparator CMP.

Figure 4:
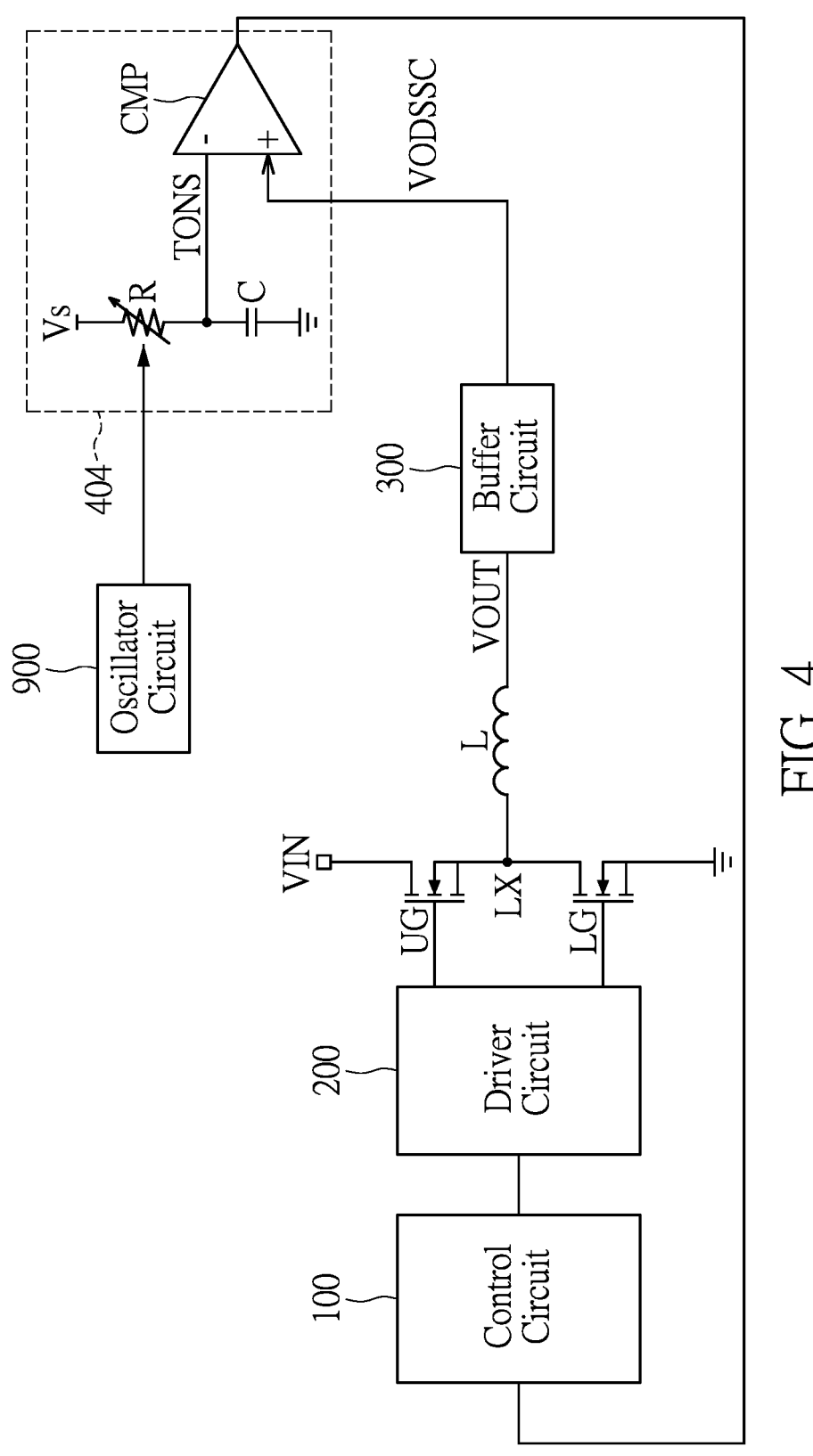
FIG. 4 is a circuit diagram of a power converter having a spectrum spreading control mechanism according to a fourth embodiment of the present disclosure.

Reference is made to FIG. 4, which is a circuit diagram of a power converter having a spectrum spreading control mechanism according to a fourth embodiment of the present disclosure.

The contents of the fourth embodiment of the present disclosure that are the same as that of the first embodiment of the present disclosure are not repeated herein. A difference between the fourth and first embodiments of the present disclosure is that, an on-time determining circuit 404 of the power converter of the fourth embodiment of the present disclosure includes a variable resistor R, the comparator CMP and the capacitor C.

A control terminal of the variable resistor R is connected to the output terminal of the oscillator circuit 900. A first terminal of the variable resistor R is coupled to the supply voltage Vs. A second terminal of the variable resistor R is connected to the first terminal of the capacitor C. The second terminal of the capacitor C is grounded. The first input terminal such as the inverting input terminal of the comparator CMP is connected to the first terminal of the capacitor C. The second input terminal such as the non-inverting input terminal of the comparator CMP is connected to the output terminal of the buffer circuit 300. The output terminal of the comparator CMP is connected to the input terminal of the control circuit 100. The output terminal of the control circuit 100 is connected to the control terminal of the high-side switch UG and the control terminal of the low-side switch LG.

A resistance of the variable resistor R depends on the oscillating signal outputted by the oscillator circuit 900. The resistance of the variable resistor R is changed with a change in the oscillating signal outputted by the oscillator circuit 900. Then, a current flowing through the capacitor C is changed with a change in the resistance of the variable resistor R. Then, the voltage of the first terminal of the capacitor C that is inputted to the first input terminal of the variable capacitor Cb is changed with a change in the current flowing through the capacitor C. The control circuit 100 switches the high-side switch UG and the low-side switch LG according to the level of the on-time instructing signal from the comparator CMP.

Reference is made to FIG. 5(*a*), which is a circuit diagram of an oscillator circuit and a buffer circuit of a power converter having a spectrum spreading control mechanism according to a fifth embodiment of the present disclosure.

For convenience of description, the buffer circuit of the fifth embodiment of the present disclosure (such as the buffer circuit 300 of FIGS. 1 to 4) includes all of the circuit components as shown in FIG. 5(*a*), but the present disclosure is not limited thereto. In practice, some of the circuit components in FIG. 5(*a*) may be omitted according to actual requirements. If some of the circuit components in FIG. 5(*a*) are omitted, others of the circuit components may be coupled to an operation control voltage instead of the omitted circuit components.

It is worth noting that, the buffer circuit of the present disclosure (such as the buffer circuit 300 of FIGS. 1 to 4) may include a main buffer circuit 311. The main buffer circuit 31 includes a plurality of buffering modulator circuits such as, but not limited to, four buffering modulator circuits 3011 to 3014 as shown in FIG. 5(*a*).

Each of the plurality of buffering modulator circuits of the buffer circuit 300 of the present disclosure may include a plurality of first transistors. For example, as shown in FIG. 5(*a*), the buffering modulator circuit 3011 includes six first transistors T111 to T116, the buffering modulator circuit 3012 includes four first transistors T121 to T124, the buffering modulator circuit 3013 includes three first transistors T131 to T133, and the buffering modulator circuit 3014 includes three first transistors T141 to T143, but the present disclosure is not limited thereto.

A first terminal of the first transistor T111 of the buffering modulator circuit 3011 is connected to a terminal of the buffer circuit 300 that receives an input voltage Vd (that is, the input terminal of the buffer circuit 300 to which the second terminal of the inductor L as shown in FIGS. 1 to 4 is connected).

A second terminal of the first transistor T111 is connected to a first terminal of the first transistor T112. A second terminal of the first transistor T112 is connected to a first terminal of the first transistor T113. A second terminal of the first transistor T113 is connected to a first terminal of the first transistor T114. A second terminal of the first transistor T114 is connected to a first terminal of the first transistor T115. A second terminal of the first transistor T115 is connected to a first terminal of the first transistor T116. A second terminal of the first transistor T116 is connected to the output terminal of the buffer circuit 300 (that is, a terminal of the buffer circuit 300 from which the buffered voltage signal VODSSC is outputted).

A first terminal of the first transistor T121 of the buffering modulator circuit 3012 is connected to the terminal of the buffer circuit 300 that receives the input voltage Vd. In the buffering modulator circuit 3012, a second terminal of the first transistor T121 is connected to a first terminal of the first transistor T122, a second terminal of the first transistor T122 is connected to a first terminal of the first transistor T123, and a second terminal of the first transistor T123 is connected to a first terminal of the first transistor T124. A second terminal of the first transistor T124 of the buffering modulator circuit 3012 is connected to the output terminal of the buffer circuit 300.

The first terminal of the first transistor T131 of the buffering modulator circuit 3013 is connected to the terminal of the buffer circuit 300 that receives the input voltage Vd. In the buffering modulator circuit 3013, a second terminal of the first transistor T131 is connected to a first terminal of the first transistor T132, and a second terminal of the first transistor T132 is connected to a first terminal of the first transistor T133. A second terminal of the first transistor T133 of the buffering modulator circuit 3013 is connected to the output terminal of the buffer circuit 300.

A first terminal of the first transistor T141 of the buffering modulator circuit 3014 is connected to the terminal of the buffer circuit 300 that receives the input voltage Vd. In the buffering modulator circuit 3014, a second terminal of the first transistor T141 is connected to a first terminal of the first transistor T142, and a second terminal of the first transistor T142 is connected to a first terminal of the first transistor T143. A second terminal of the first transistor T143 of the buffering modulator circuit 3014 is connected to the output terminal of the buffer circuit 300.

It is worth noting that, a control terminal of at least one of the plurality of first transistors included in each of the plurality of buffering modulator circuits of the buffer circuit 300 of the present disclosure is connected to the output terminal of the oscillator circuit 900. The at least one of the plurality of first transistors included in each of the plurality of buffering modulator circuits of the buffer circuit 300 is turned on or off by the oscillator circuit 900. The buffering ratio of a voltage of the voltage signal of the inductor L of the power converter of the present disclosure is set to different values by controlling different numbers of the plurality of first transistors to operate.

For example, as shown in FIG. 5(*a*), the control terminal of the first transistor T115 of the buffering modulator circuit 3011, the control terminal of the first transistor T123 of the buffering modulator circuit 3012, the control terminal of the first transistor T132 of the buffering modulator circuit 3013 and the control terminal of the first transistor T142 of the buffering modulator circuit 3015 are connected to the output terminal of the oscillator circuit 900, but present disclosure is not limited thereto.

For example, if the plurality of first transistors T115, T123, T132, T142 may be n-type metal-oxide-semiconductor field-effect transistors (NMOSFETs), the oscillator circuit 900 may output the plurality of oscillating signals each having a voltage level "0" respectively to the control terminals of the plurality of first transistors T115, T123, T132, T142. The voltage levels of the plurality of oscillating signals that are respectively outputted to the plurality of first transistors T115, T123, T132, T142 are represented by "0000" as follows. The voltage levels of the oscillating signals that are respectively outputted to the control terminals of the plurality of first transistors T115, T123, T132, T142 may be changed from "0000" sequentially to "0001"→"0010"→"0011"→"0100"→"0101"→"0110"→

"0111"→"1000"→"1001"→"1010"→"1011"→"1100"→"1101" but the present disclosure is not limited thereto. That is, the oscillator circuit 900 may alternatively output the plurality of oscillating signals each having the voltage level "1" for alternatively turning on the plurality of first transistors T115, T123, T132, T142, according to an arrangement order of the plurality of first transistors T115, T123, T132, T142.

Figure 5A:
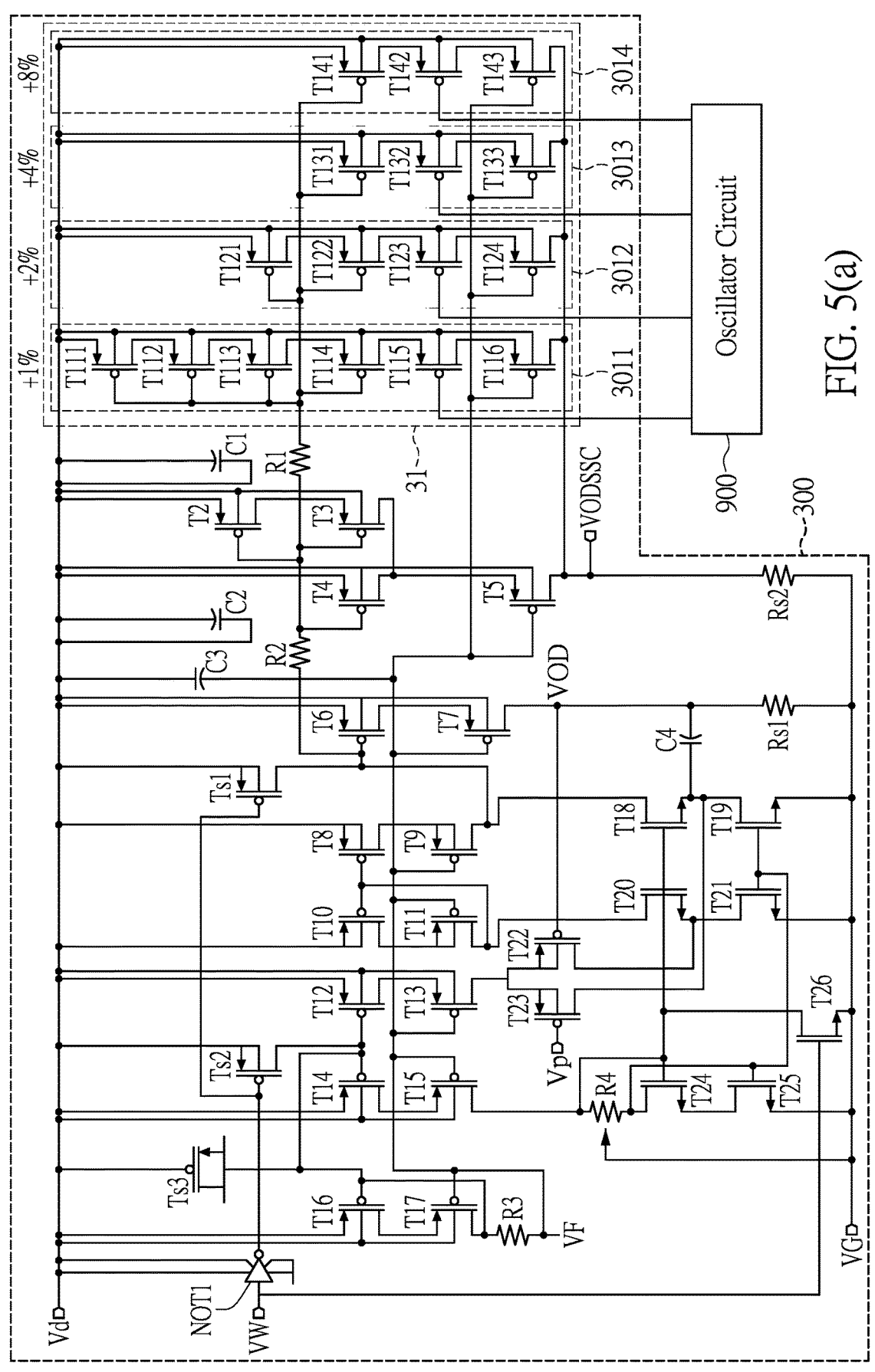
FIG. 5(a) is a circuit diagram of an oscillator circuit and a buffer circuit of a power converter having a spectrum spreading control mechanism according to a fifth embodiment of the present disclosure.

If the plurality of first transistors T115, T123, T132, T142 may be p-type metal-oxide-semiconductor field-effect transistors (PMOSFETs) as shown in FIG. 5(a), the oscillator circuit 900 may output the plurality of oscillating signals each having a voltage level "1" respectively to the control terminals of the plurality of first transistors T115, T123, T132, T142. The voltage levels of the plurality of oscillating signals that are respectively outputted to the control terminals of the plurality of first transistors T115, T123, T132, T142 are represented by "1111" as follows. The voltage levels of the plurality of oscillating signals that are respectively outputted to the control terminals of the plurality of first transistors T115, T123, T132, T142 may be changed from "1111" sequentially to "1110"→"1101"→"1100"→"1011"→"1010"→"1001"→ "1000"→"0111"→"0110"→"0101"→"0100"→"0011"→ "0010"→"0001"→"0000", but the present disclosure is not limited thereto. That is, the oscillator circuit 900 alternatively output the plurality of oscillating signals each having the voltage level "0" for alternatively turning on the plurality of first transistors T115, T123, T132, T142, according to the arrangement order of the plurality of first transistors T115, T123, T132, T142.

Alternatively, the oscillator circuit 900 may randomly turn on the plurality of first transistors T115, T123, T132, T142.

When the oscillator circuit 900 turns on the first transistor T115 of the buffering modulator circuit 3011, the first transistors T111 to T114, T116 of the buffering modulator circuit 3011 are also turned on. Under this condition, the buffering modulator circuit 3011 provides a buffering ratio of 1% for buffering of the voltage of the voltage signal of the inductor L.

When the oscillator circuit 900 turns on the first transistor T123 of the buffering modulator circuit 3012, the first transistors T121, T122, T124 of the buffering modulator circuit 3012 are also turned on. Under this condition, the buffering modulator circuit 3012 provides a buffering ratio of 2% for buffering of the voltage of the voltage signal of the inductor L.

When the oscillator circuit 900 turns on the first transistor T132 of the buffering modulator circuit 3013, the first transistors T131, T133 of the buffering modulator circuit 3013 are also turned on. Under this condition, the buffering modulator circuit 3013 provides a buffering ratio of 4% for buffering of the voltage of the voltage signal of the inductor L.

When the oscillator circuit 900 turns on the first transistor T142 of the buffering modulator circuit 3014, the first transistors T141, T143 of the buffering modulator circuit 3014 are also turned on. Under this condition, the buffering modulator circuit 3014 provides a buffering ratio of 8% for buffering of the voltage of the voltage signal of the inductor L.

If necessary, the buffer circuit of the power converter of the present disclosure may further include all or some of the following buffer circuit components: a second transistor T2 to a twenty-sixth transistor T26, switching transistors Ts1 to Ts3, a first capacitor C1 to a fourth capacitor C4, a first resistor R1 to a fourth resistor R4, an inverter NOT1, a first auxiliary resistor Rs1 and a second auxiliary resistor Rs2.

A first terminal of the first capacitor C1 and a first terminal of the second capacitor C2 are connected to the terminal of the buffer circuit 300 that receives the input voltage Vd. A second terminal of the first capacitor C1 and a second terminal of the second capacitor C2 are connected to a first terminal of each of the plurality of first transistors T111, T121, T131, T141.

A first terminal of the second transistor T2 is connected to the terminal of the buffer circuit 300 that receives the input voltage Vd. A second terminal of the second transistor T2 is connected to a first terminal of the third transistor T3.

A second terminal of the third transistor T3 is connected to a first terminal of the fifth transistor T5. A first terminal of the fourth transistor T4 is connected to the terminal of the buffer circuit 300 that receives the input voltage Vd. A first terminal of the fifth transistor T5 is connected to a second terminal of the fourth transistor T4. A second terminal of the fifth transistor T5 is connected to the output terminal of the buffer circuit 300 (that is, the terminal of the buffer circuit 300 from which the buffered voltage signal VODSSC is outputted, as described above). The output terminal of the buffer circuit 300 is connected to an input terminal of the on-time determining circuit (such as the on-time determining circuits 401 to 404 as shown in FIG. 1 to FIG. 4).

A second terminal of the fifth transistor T5 is connected to a first terminal of the second auxiliary resistor Rs2. A second terminal of the second auxiliary resistor Rs2 is coupled to a second reference voltage level VG.

A control terminal of the second transistor T2, a control terminal of the third transistor T3 and a control terminal of the fourth transistor T4 may be connected to a second terminal of the first transistor R1. A control terminal of the fifth transistor T5 is coupled to a first reference voltage level VF. A first terminal of the first transistor R1 may be connected to a control terminal of each of the plurality of first transistors T111 to T114, T121, T122, T131, T141. A control terminal of each of the plurality of first transistors T116, T124, T133, T143 may be coupled to the first reference voltage level VF and connected to the control terminal of the fifth transistor T5.

A first terminal of the third capacitor C3 is connected to the terminal of the buffer circuit 300 that receives the input voltage Vd. A second terminal of the third capacitor C3 is connected to the control terminal of the fifth transistor T5.

A first terminal of the second resistor R2 is connected to the control terminal of the second transistor T2, the control terminal of the third transistor T3, the control terminal of the fourth transistor T4 and the first terminal of the first transistor R1. The second terminal of the first transistor R1 is connected to a control terminal of the sixth transistor T6.

A first terminal of the sixth transistor T6 is connected to the terminal of the buffer circuit 300 that receives the input voltage Vd. A second terminal of the sixth transistor T6 is connected to a first terminal of the seventh transistor T7. A control terminal of the seventh transistor T7 is coupled to the first reference voltage level VF and connected to the control terminal of the fifth transistor T5. A second terminal of the seventh transistor T7 is connected to a first terminal of the first auxiliary resistor Rs1. A voltage of the second terminal of the seventh transistor T7 is represented by VOD in FIG. 5(a). A second terminal of the first auxiliary resistor Rs1 is coupled to the second reference voltage level VG.

A first terminal of the eighth transistor T8 is connected to the terminal of the buffer circuit 300 that receives the input voltage Vd. A second terminal of the eighth transistor T8 is connected to a first terminal of the ninth transistor T9. A control terminal of the ninth transistor T9 is coupled to the first reference voltage level VF. A second terminal of the ninth transistor T9 is connected to the control terminal of the sixth transistor T6 and a second terminal of the switching transistor Ts1. A first terminal of the switching transistor Ts1 is connected to the terminal of the buffer circuit 300 that receives the input voltage Vd. A control terminal of the switching transistor Ts1 may be connected to an input terminal of an inverter NOT (that is not a non-essential component). An input terminal of the inverter NOT is coupled to an operation control voltage VW.

A first terminal of the tenth transistor T10 is connected to the terminal of the buffer circuit 300 that receives the input voltage Vd. A second terminal of the tenth transistor T10 is connected to a first terminal of the eleventh transistor T11. A second terminal of the eleventh transistor T11 is connected to a control terminal of the eighth transistor T8 and a control terminal of the tenth transistor T10. A control terminal of the eleventh transistor T11 is coupled to the first reference voltage level VF.

A first terminal of the twelfth transistor T12 is connected to the terminal of the buffer circuit 300 that receives the input voltage Vd. A first terminal of the thirteenth transistor T13 is connected to a second terminal of the twelfth transistor T12.

A first terminal of the fourteenth transistor T14 is connected to the terminal of the buffer circuit 300 that receives the input voltage Vd. A control terminal of the fourteenth transistor T14 is connected to a control terminal of the twelfth transistor T12. A first terminal of the fifteenth transistor T15 is connected to a second terminal of the fourteenth transistor T14. A second terminal of the fifteenth transistor T15 is coupled to the second reference voltage level VG. A control terminal of the fifteenth transistor T15 and a control terminal of the thirteenth transistor T13 are coupled to the first reference voltage level VF.

A first terminal of the switching transistor Ts2 is connected to the terminal of the buffer circuit 300 that receives the input voltage Vd. A second terminal of the switching transistors Ts2 is connected to the control terminal of the twelfth transistor T12 and the control terminal of the fourteenth transistor T14. A control terminal of the switching transistors Ts2 is connected to an output terminal of the inverter NOT. The input terminal of the inverter NOT is coupled to the operation control voltage VW.

A first terminal of the sixteenth transistor T16 is connected to the terminal of the buffer circuit 300 that receives the input voltage Vd. A control terminal of the sixteenth transistor T16 is connected to the control terminal of the fourteenth transistor T14, the control terminal of the twelfth transistor T12 and a first terminal of the third resistor R3.

A first terminal of the seventeenth transistor T17 is connected to a second terminal of the sixteenth transistor T16. A second terminal of the seventeenth transistor T17 is connected to the first terminal of the third resistor R3. A second terminal of the third resistor R3 is coupled to the first reference voltage level VF. A control terminal of the seventeenth transistor T17 is connected to the control terminal of the fifteenth transistor T15 and coupled to the first reference voltage level VF.

A control terminal of the switching transistor Ts3 is connected to the terminal of the buffer circuit 300 that receives the input voltage Vd. A first terminal of the switching transistor Ts3 may be coupled to a first control voltage level (not shown in figures). A second terminal of the switching transistor Ts3 may be coupled to a second control voltage level (not shown in figures).

A first terminal of the eighteenth transistor T18 is connected to the second terminal of the ninth transistor T9 and the control terminal of the sixth transistor T6. A second terminal of the eighteenth transistor T18 is connected to a first terminal of the nineteenth transistor T19. A second terminal of the nineteenth transistor T19 is coupled to the second reference voltage level VG.

A first terminal of the twentieth transistor T20 is connected to the second terminal of the eleventh transistor T11. A control terminal of the twentieth transistor T20 is connected to a control terminal of the eighteenth transistor T18. A first terminal of the twenty-first transistor T21 is connected to a second terminal of the twentieth transistor T20. A second terminal of the twenty-first transistor T21 is coupled to the second reference voltage level VG. A control terminal of the twenty-first transistor T21 is connected to a control terminal of the nineteenth transistor T19.

A first terminal of the capacitor C4 is connected to the second terminal of the seventh transistor T7. A second terminal of the capacitor C4 is connected to the first terminal of the nineteenth transistor T19.

A first terminal of the twenty-second transistor T22 is connected to a second terminal of the thirteenth transistor T13. A second terminal of the twenty-second transistor T22 is connected to the first terminal of the twenty-first transistor T21. A control terminal of the twenty-second transistor T22 is connected to the second terminal of the seventh transistor T7. A first terminal of the twenty-third transistor T23 is connected to the second terminal of the thirteenth transistor T13. A second terminal of the twenty-third transistor T23 is connected to the first terminal of the nineteenth transistor T19. A control terminal of the twenty-third transistor T23 is coupled to a control voltage level Vp.

A first terminal of the twenty-fourth transistor T24 is connected to a second terminal of the fourth resistor R4. A first terminal of the fourth resistor R4 is connected to the second terminal of the fifteenth transistor T15. A control terminal of the twenty-fourth transistor T24 is connected to the control terminal of the twentieth transistor T20.

A first terminal of the twenty-fifth transistor T25 is connected to a second terminal of the twenty-fourth transistor T24. A second terminal of the twenty-fifth transistor T25 is coupled to the second reference voltage level VG. A control terminal of the twenty-fifth transistor T25 is connected to the first terminal of the twenty-fourth transistor T24 and the control terminal of the twenty-first transistor T21.

A first terminal of the twenty-sixth transistor T26 is connected to the control terminal of the twenty-fourth transistor T24 and the control terminal of the twentieth transistor T20. A second terminal of the twenty-sixth transistor T26 is coupled to the second reference voltage level VG. A control terminal of the twenty-sixth transistor T26 is coupled to the operation control voltage VW.

Figure 5B:
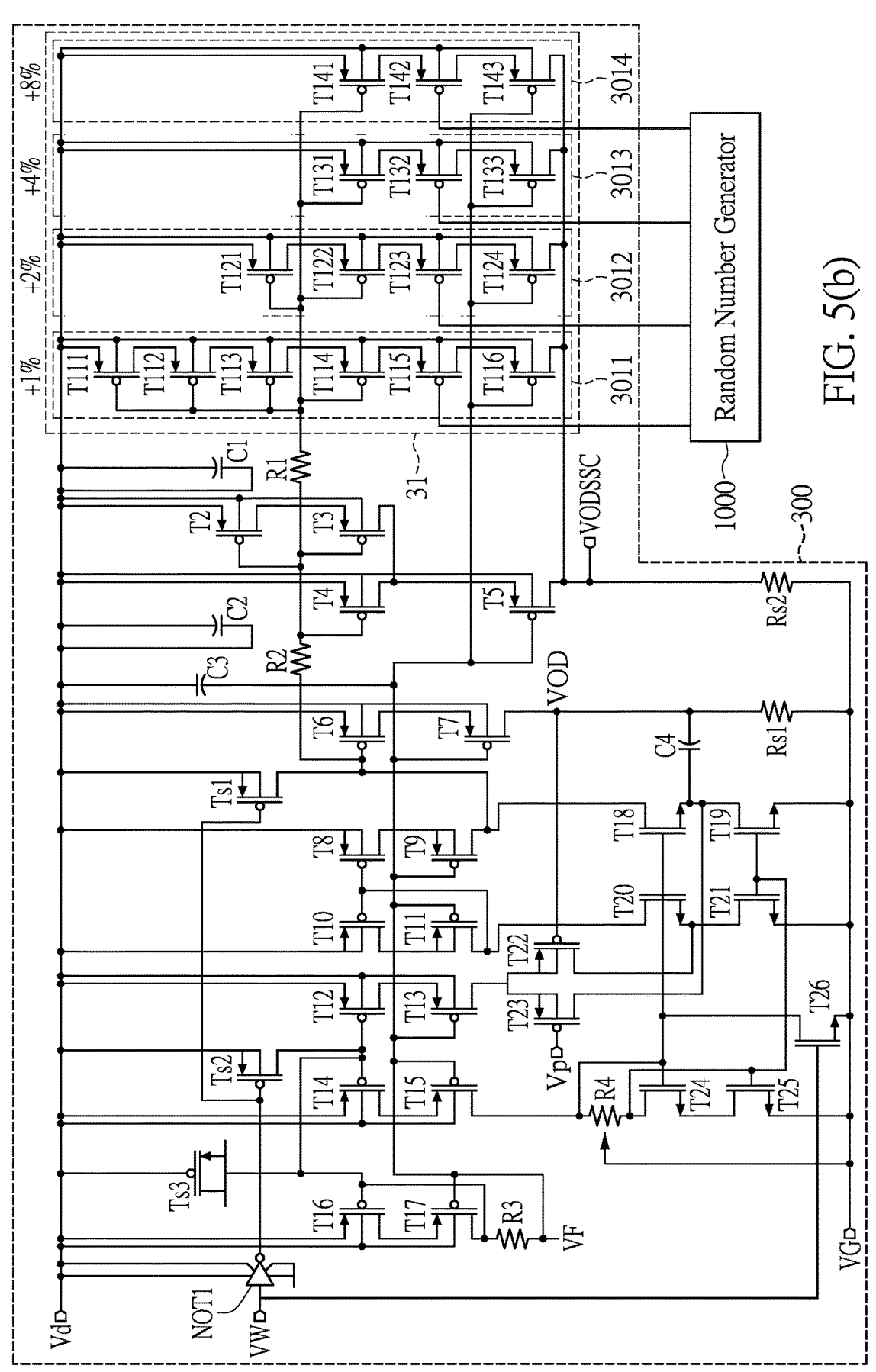
FIG. 5(b) is a circuit diagram of a random number generator and a buffer circuit of a power converter having a spectrum spreading control mechanism according to a sixth embodiment of the present disclosure.

Reference is made to FIG. 5(b), which is a circuit diagram of a random number generator and a buffer circuit of a power converter having a spectrum spreading control mechanism according to a sixth embodiment of the present disclosure. The contents of the sixth embodiment of the present disclosure that are the same as that of the fifth embodiment of the present disclosure are not repeated herein.

As shown in FIG. 5(b), the power converter of the sixth embodiment of the present disclosure includes a random number generator 1000 for outputting a plurality of random number signals (having random values). The oscillator circuit 900 that are used for outputting the plurality of oscillating signals (having preset values) as shown in shown in FIG. 5(*a*) is replaced by the random number generator 1000 in the sixth embodiment of the present disclosure. In addition, the oscillator circuit 900 as shown in FIGS. 2 to 4 may also be replaced by the random number generator 1000 as shown in FIG. 5(*b*).

In conclusion, the present disclosure provides the power converter having the spectrum spreading control mechanism. In the power converter of the present disclosure, the original switching frequency of the high-side switch and the low-side switch is divided into a plurality of switching frequencies that are distributed in the plurality of frequency bands within the switching frequency range. As a result, each time when the high-side switch and the low-side switch are switched, the switching frequency of the high-side switch and the low-side switch does not exceed an upper limit value. Under this condition, strength of the electromagnetic interference (EMI) signal generated when the high-side switch and the low-side switch are switched is effectively reduced. Therefore, the power converter of the present disclosure is capable of operating normally, and an operating efficiency of the power converter of the present disclosure is improved.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A power converter having a spectrum spreading control mechanism, comprising:
a high-side switch, wherein a first terminal of the high-side switch is coupled to an input voltage;
a low-side switch, wherein a first terminal of the low-side switch is connected to a second terminal of the high-side switch, a second terminal of the low-side switch is grounded, and a node between the first terminal of the low-side switch and the second terminal of the high-side switch is connected to a first terminal of an inductor;
a driver circuit connected to a control terminal of the high-side switch and a control terminal of the low-side switch;
a control circuit connected to the driver circuit and configured to control the driver circuit to drive the high-side switch and the low-side switch;
a buffer circuit having an input terminal connected to a second terminal of the inductor, wherein the buffer circuit, according to a plurality of energy upper limit values respectively of a plurality of frequency bands falling within a switching frequency range, determines a plurality of buffering ratios corresponding respectively to the plurality of frequency bands between which a switching frequency of the high-side switch and the low-side switch is changed, and each time when the input terminal of the buffer circuit receives a voltage signal from the inductor, the buffer circuit buffers a voltage of the voltage signal from the inductor based on one of the plurality of buffering ratios that corresponds to one of the plurality of frequency bands within which the switching frequency of the high-side switch and the low-side switch currently falls; and
an on-time determining circuit connected to the buffer circuit and the control circuit, and configured to determine an on-time of the high-side switch and an on-time of the low-side switch to output an on-time instructing signal according to the voltage signal that is buffered by the buffer circuit;
wherein the control circuit controls the driver circuit to drive the high-side switch and the low-side switch according to the on-time instructing signal from the on-time determining circuit;
wherein the buffer circuit includes:
a plurality of buffering modulator circuit each including a plurality of first transistors, wherein, in each of the plurality of buffering modulator circuits, a first terminal of one of the plurality of first transistors is connected to an input terminal of the buffer circuit, a second terminal of another of the plurality of first transistors is connected to an input terminal of the on-time determining circuit, and a first terminal of each of the plurality of first transistors except for the one of the plurality of first transistors is connected to a second terminal of the first transistor disposed adjacent thereto;
wherein, in each of the plurality of buffering modulator circuits, a control terminal of at least one of the plurality of first transistors is connected to an oscillator circuit, and control terminals of others of the plurality of first transistors are coupled to an operation control voltage.

2. The power converter according to claim 1, wherein the buffer circuit further includes:
a second transistor, wherein a first terminal of the second transistor is connected to the input terminal of the buffer circuit;
a third transistor, wherein a first terminal of the third transistor is connected to a second terminal of the second transistor;
a fourth transistor, wherein a first terminal of the fourth transistor is connected to the input terminal of the buffer circuit; and
a fifth transistor, wherein a first terminal of the fifth transistor is connected to a second terminal of the fourth transistor and a second terminal of the third transistor, and a second terminal of the fifth transistor is connected to the input terminal of the on-time determining circuit;
wherein a control terminal of the second transistor, a control terminal of the third transistor, and a control terminal of the fourth transistor are coupled to the operation control voltage, and a control terminal of the fifth transistor is coupled to a first reference voltage level.

3. The power converter according to claim 2, wherein the buffer circuit further includes:
a sixth transistor, wherein a first terminal of the sixth transistor is connected to the input terminal of the buffer circuit and a control terminal of the sixth transistor is coupled to the operation control voltage; and
a seventh transistor, wherein a first terminal of the seventh transistor is connected to a second terminal of the sixth transistor, a second terminal of the seventh transistor is coupled to a second reference voltage level, and a control terminal of the seventh transistor is coupled to the second reference voltage level.

4. The power converter according to claim 3, wherein the buffer circuit further includes:

a switching transistor, wherein a first terminal of the switching transistor is connected to the input terminal of the buffer circuit, a second terminal of the switching transistor is connected to a control terminal of the sixth transistor, and a control terminal of the switching transistor is coupled to the operation control voltage.

5. The power converter according to claim 3, wherein the buffer circuit further includes:

an eighth transistor, wherein a first terminal of the eighth transistor is connected to the input terminal of the buffer circuit;

a ninth transistor, wherein a first terminal of the ninth transistor is connected to a second terminal of the eighth transistor, a second terminal of the ninth transistor is connected to the control terminal of the sixth transistor, and a control terminal of the ninth transistor is coupled to the second reference voltage level;

a tenth transistor, wherein a first terminal of the tenth transistor is connected to the input terminal of the buffer circuit; and an eleventh transistor, wherein a first terminal of the eleventh transistor is connected to a second terminal of the tenth transistor, a second terminal of the eleventh transistor is connected to a control terminal of the eighth transistor and a control terminal of the tenth transistor, and a control terminal of the eleventh transistor is coupled to the second reference voltage level.

6. The power converter according to claim 5, wherein the buffer circuit further includes:

a twelfth transistor, wherein a first terminal of the twelfth transistor is connected to the input terminal of the buffer circuit;

a thirteenth transistor, wherein a first terminal of the thirteenth transistor is connected to a second terminal of the twelfth transistor, and a second terminal of the thirteenth transistor is coupled to the second reference voltage level;

a fourteenth transistor, wherein a first terminal of the fourteenth transistor is connected to the input terminal of the buffer circuit, and a control terminal of the fourteenth transistor is connected to a control terminal of the twelfth transistor; and a fifteenth transistor, wherein a first terminal of the fifteenth transistor is connected to a second terminal of the fourteenth transistor, a second terminal of the fifteenth transistor is coupled to the second reference voltage level, and a control terminal of the fifteenth transistor is connected to a control terminal of the thirteenth transistor and coupled to the first reference voltage level.

7. The power converter according to claim 6, wherein the buffer circuit further includes:

a switching transistor, wherein a first terminal of the switching transistor is connected to the input terminal of the buffer circuit, a second terminal of the switching transistor is connected to the control terminal of the twelfth transistor, and a control terminal of the switching transistor is coupled to the operation control voltage.

8. The power converter according to claim 7, wherein the buffer circuit further includes:

a sixteenth transistor, wherein a first terminal of the sixteenth transistor is connected to the input terminal of the buffer circuit, and a control terminal of the sixteenth transistor is connected to the control terminal of the fourteenth transistor; and a seventeenth transistor, wherein a first terminal of the seventeenth transistor is connected to a second terminal of the sixteenth transistor, a second terminal of the sixteenth transistor is coupled to the first reference voltage level, and a control terminal of the seventeenth transistor is connected to the control terminal of the fifteenth transistor.

9. The power converter according to claim 8, wherein the buffer circuit further includes:

an eighteenth transistor, wherein a first terminal of the eighteenth transistor is connected to the second terminal of the ninth transistor;

a nineteenth transistor, wherein a first terminal of the nineteenth transistor is connected to a second terminal of the eighteenth transistor, and a second terminal of the nineteenth transistor is coupled to the second reference voltage level;

a twentieth transistor, wherein a first terminal of the twentieth transistor is connected to a second terminal of the eleventh transistor, and a control terminal of the twentieth transistor is connected to a control terminal of the eighteenth transistor; and a twenty-first transistor, wherein a first terminal of the twenty-first transistor is connected to a second terminal of the twentieth transistor, a second terminal of the twenty-first transistor is coupled to the second reference voltage level, and a control terminal of the twenty-first transistor is connected to a control terminal of the nineteenth transistor.

10. The power converter according to claim 9, wherein the buffer circuit further includes:

a twenty-second transistor, wherein a first terminal of the twenty-second transistor is connected to the second terminal of the thirteenth transistor, a second terminal of the twenty-second transistor is connected to the first terminal of the twenty-first transistor, and a control terminal of the twenty-second transistor is connected to the second terminal of the seventh transistor; and a twenty-third transistor, wherein a first terminal of the twenty-third transistor is connected to the second terminal of the thirteenth transistor, a second terminal of the twenty-third transistor is connected to the first terminal of the nineteenth transistor, and a control terminal of the twenty-third transistor is coupled to a control voltage level.

11. The power converter according to claim 10, wherein the buffer circuit further includes:

a twenty-fourth transistor, wherein a first terminal of the twenty-fourth transistor is connected to the second terminal of the fifteenth transistor, and a control terminal of the twenty-fourth transistor is connected to the control terminal of the twentieth transistor; and a twenty-fifth transistor, wherein a first terminal of the twenty-fifth transistor is connected to the second terminal of the twenty-fourth transistor, a second terminal of the twenty-fifth transistor is coupled to the second reference voltage level, and a control terminal of the twenty-fifth transistor is connected to the first terminal of the twenty-fourth transistor and the control terminal of the twenty-first transistor.

12. The power converter according to claim 10, wherein the buffer circuit further includes:

a twenty-sixth transistor, wherein a first terminal of the twenty-sixth transistor is connected to the control terminal of the twenty-fourth transistor, a second terminal of the twenty-sixth transistor is coupled to the second reference voltage level, and a control terminal of the twenty-sixth transistor is coupled to the operation control voltage.

13. The power converter according to claim 1, wherein the on-time determining circuit includes:

a constant current source coupled to a supply voltage;

a capacitor, wherein a first terminal of the capacitor is connected to the constant current source and a second terminal of the capacitor is grounded; and a comparator, wherein a first input terminal of the comparator is connected to the first terminal of the capacitor, a second input terminal of the comparator is connected to an output terminal of the buffer circuit, and an output terminal of the comparator is connected to an input terminal of the control circuit.

14. The power converter according to claim 1, wherein the on-time determining circuit includes:

a variable current source, wherein a control terminal of the variable current source is connected to an output terminal of the oscillator circuit;

a capacitor, wherein a first terminal of the capacitor is connected to an output terminal of the variable current source, and a second terminal of the capacitor is grounded; and a comparator, wherein a first input terminal of the comparator is connected to the first terminal of the capacitor, a second input terminal of the comparator is connected to an output terminal of the buffer circuit, and an output terminal of the comparator is connected to an input terminal of the control circuit.

15. The power converter according to claim 1, wherein the on-time determining circuit includes:

a constant current source coupled to a supply voltage;

a variable capacitor, wherein a first terminal of the variable capacitor is connected to the constant current source, a second terminal of the variable capacitor is grounded, and a control terminal of the variable capacitor is connected to an output terminal of the oscillator circuit; and a comparator, wherein a first input terminal of the comparator is connected to the first terminal of the variable capacitor, a second input terminal of the comparator is connected to an output terminal of the buffer circuit, and an output terminal of the comparator is connected to an input terminal of the control circuit.

16. The power converter according to claim 1, wherein the on-time determining circuit includes:

a variable resistor, wherein a first terminal of the variable resistor is coupled to a supply voltage, and a control terminal of the variable resistor is connected to an output terminal of the oscillator circuit;

a capacitor, wherein a first terminal of the capacitor is connected to a second terminal of the variable resistor, and a second terminal of the capacitor is grounded; and a comparator, wherein a first input terminal of the comparator is connected to the first terminal of the capacitor, a second input terminal of the comparator is connected to an output terminal of the buffer circuit, and an output terminal of the comparator is connected to an input terminal of the control circuit.

* * * * *